(12) United States Patent
Tanaka (10) Patent No.: US 6,426,266 B1
(45) Date of Patent: Jul. 30, 2002

(54) MANUFACTURING METHOD FOR AN INVERTED-STRUCTURE BIPOLAR TRANSISTOR WITH IMPROVED HIGH-FREQUENCY CHARACTERISTICS

(75) Inventor: Shinichi Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/661,802

(22) Filed: Sep. 14, 2000

Related U.S. Application Data (62) Division of application No. 09/217,061, filed on Dec. 21, 1998, now Pat. No. 6,147,371.

(30) Foreign Application Priority Data

Dec. 22, 1997 (JP) .............................................. 9-352746

(51) Int. Cl.⁷ .................... H01L 21/331; H01L 21/8222
(52) U.S. Cl. ...................................................... 438/315
(58) Field of Search ................................. 257/197–198, 257/27, 187, 192–195; 438/312–321

(56) References Cited

U.S. PATENT DOCUMENTS

| | | | | |
|---|---|---|---|---|
| 4,768,074 A | * | 8/1988 | Yoshida et al. | 257/198 |
| 4,958,208 A | | 9/1990 | Tanaka | 357/34 |
| 5,147,775 A | | 9/1992 | Ota et al. | 437/31 |
| 5,289,020 A | | 2/1994 | Hirose et al. | 257/197 |
| 5,321,302 A | * | 6/1994 | Shimawaki | 257/592 |
| 5,329,145 A | | 7/1994 | Nakagawa | 257/198 |
| 5,508,536 A | | 4/1996 | Twynam et al. | 257/197 |

FOREIGN PATENT DOCUMENTS

| | | | | |
|---|---|---|---|---|
| JP | S61-123176 | | 6/1986 | |
| JP | S61-123178 | | 6/1986 | |
| JP | S64-57666 | | 3/1989 | |
| JP | H1-132161 | | 5/1989 | |
| JP | H1-215065 | | 8/1989 | |
| JP | 1-241166 | | 9/1989 | |
| JP | H2-49432 | | 2/1990 | |
| JP | 402284431 | | 11/1990 | 257/197 |
| JP | 3-108339 | | 5/1991 | |
| JP | 4-83345 | * | 3/1992 | 438/763 |
| JP | 4-83346 | * | 3/1992 | 438/763 |
| JP | 404103134 | | 4/1992 | 257/197 |
| JP | H4-206833 | | 7/1992 | |
| JP | H5-109755 | | 4/1993 | |
| JP | 405109755 | | 4/1993 | 257/197 |
| JP | 6-252163 | | 9/1994 | |
| JP | 6-338515 | | 12/1994 | |
| JP | 8-167615 | | 6/1996 | |

OTHER PUBLICATIONS

Communication, dated Aug. 7, 2001, from Japanese Patent Office in a corresponding Japanese patent application, and partial English language translation thereof.

* cited by examiner

*Primary Examiner*—Howard Weiss
*Assistant Examiner*—Marcos D. Pizarro-Crespo
(74) *Attorney, Agent, or Firm*—Sughrue Mion, PLLC (57) ABSTRACT

In an element intrinsic region 12 of a bipolar transistor, an emitter is formed by two emitter layers 31,32 so as to reduce the potential barrier presented to minority carriers, this resulting in a smooth flow of minority carriers that are injected into the base layer from the emitter, and in the element external region 13, the emitter layer 32 that acts to reduce the potential barrier to injected minority carriers is removed, thereby suppressing the injection of minority carriers from the emitter layer 31 into the base layer.

2 Claims, 8 Drawing Sheets

MEDIUM IMPURITY CONCENTRATION LAYER

ION IMPLANTED EXTERNAL BASE LAYER

FIG. 12
PRIOR ART

REGION CHANGED TO SEMI-INSULATOR

25b CARRIER INJECTION IN INTRINSIC REGION
25a CARRIER INJECTION INTO EXTERNAL REGION

//.

MANUFACTURING METHOD FOR AN INVERTED-STRUCTURE BIPOLAR TRANSISTOR WITH IMPROVED HIGH-FREQUENCY CHARACTERISTICS

This is a divisional of application Ser. No. 09/217,061, filed Dec. 21, 1998, now U.S. Pat. No. 6,147,371, the disclosure of which is incorporated herein by reference.

BACKGROUND OF THE INVENTION

1. Field of the Invention

The present invention relates to a bipolar transistor and to a manufacturing method for a bipolar transistor, and more specifically to an inverted-structure bipolar transistor with improved high-frequency characteristics, in which the collector is positioned above the emitter, and a manufacturing method for this bipolar transistor.

2. Background of the Invention

Because a bipolar transistor, in contrast to a field-effect transistor (FET), has a structure in which current flows in a direction that is perpendicular with respect to a substrate, the amount of current that can be injected per effective element surface area is large. For this reason, in applications such as integrated circuits and microwave elements, bipolar transistors are particularly applicable because of their high current driving capability and high power density. In recent years, bipolar transistors having an emitter with a wide energy gap compared to that of the base, that is, hetero-junction bipolar transistors (hereinafter referred to as HBTs) have, along with field-effect transistors, come to be used in a variety of high-speed circuit elements and high-frequency elements. However, to apply characteristics such as those of an HBT at even high frequencies, it is necessary to improve the maximum oscillation frequency (fmax) which is a measure of the performance of an HBT. The value of fmax of an HBT can be approximated by the following equation.

$$fmax \approx (f_T/8\pi R_B C_{BC})^{1/2} \qquad (1)$$

In the above equation, $R_B$ is the base resistance, $C_{BC}$ is the base-collector capacitance, and $f_T$ is the common-emitter current gain cutoff frequency. When an element is operating at a sufficiently high current, this cutoff frequency $f_T$ can be approximated by the following equation.

$$f_T \approx 1/2\pi[(R_B+R_C)\,C_{BC}+T_F] \qquad (2)$$

In the above equation, $R_E$ and $R_C$ are the emitter resistance and collector resistance, respectively, and $T_F$ is the travel time of minority carriers in the region formed by the combination of the neutral base layer and the collector depletion layer. In recent years, as a result of significant advances in achieving thin elements, reduced feature sizes and improved electrodeforming technologies, $f_T$ has almost reached a limit which is established by the characteristics of the semiconductor material. Because of this situation, in order to improve fmax to even further, it is effective, as seen from the relationship shown in Equation (1), to make $R_B$ and $C_{BC}$ as small as possible. In the usual HBT, however, because there is a tradeoff relationship between $R_B$ and $C_{BC}$, it is not easy to make both of these values small. This will be explained in terms of the prior art, which is shown in FIG. 9.

Figure 9:
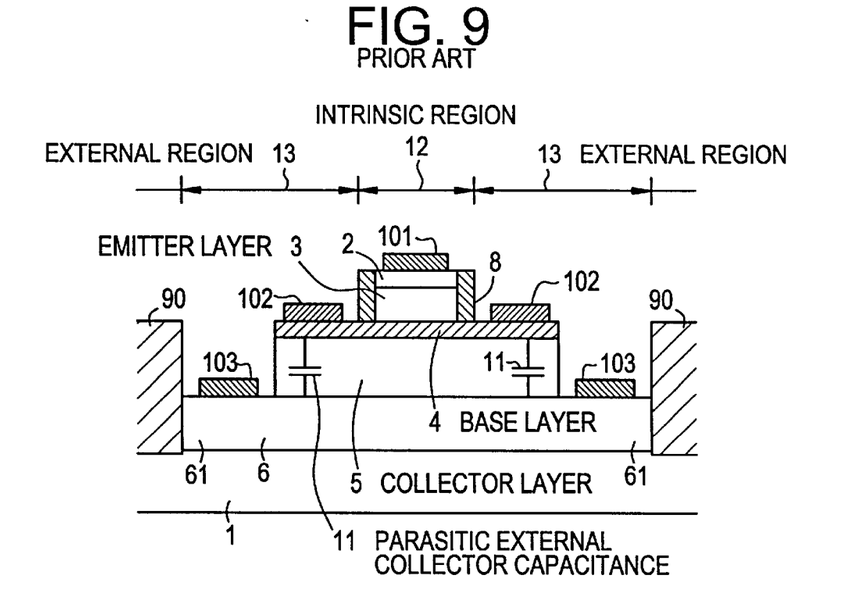
FIG. 9 is a cross-sectional view that illustrates an HBT with an emitter on top from the prior art.

In FIG. 9, the MBE (molecular beam epitaxy) method is used to grow, onto a semi-insulator GaAs substrate 1, a collector-contact layer 6 having a thickness of 500 nm made from an n-type GaAs with silicon added to a high concentration ($3\times10^{16}$ cm$^{-3}$), a collector layer 5 having a thickness of 500 nm made of n-type GaAs having silicon added to a low concentration ($5\times10^{16}$ cm$^{-3}$), a base layer 4 having a thickness of 80 nm and made from p-type GaAs with beryllium added to a high concentration ($4\times10^{19}$ cm$^{-3}$), an emitter layer 3 having a thickness of 250 nm made of n-type Al$_{0.25}$Ga$_{0.75}$As with silicon added to a medium concentration ($5\times10^{17}$ cm$^{-3}$), and an emitter contact layer 2 having a thickness of 150 nm made of n-type GaAs with silicon added to a high concentration ($3\times10^{18}$ cm$^{-3}$), these being formed in the above-noted sequence.

Next, after crystal growth, an emitter electrode 101 using an AuGe metal alloy is formed first, using lift off method. Next, photoresist that defines the emitter region is patterned, and dry etching is done using chlorine gas so as to etch the emitter contact layer 2, thereby exposing the base layer 4. Next, lift off method is used to provide a non-alloy type of base electrode 102, made from titan, platinum, and gold, after which wet etching using a phosphoric acid hydrogen peroxide water solution is done to etch to the collector layer 5, with lift off being done at the point at which the sub-collector layer 61 appears, so as to form a AuGe metallic alloy collector electrode 103.

Finally, deep ion implantation (with an implantation energy of 200 keV, and a dose amount of $5\times10^{12}$ cm$^{-2}$) is used to form an element separation region 90, thereby completing the formation of the element.

In an HBT such as illustrated in FIG. 9, to reduce parasitic external collector capacitance in the external region 13 of the element, it is necessary to reduce the dimensions of the element external region 13. However, if the dimensions of the element external region 13 are made extremely small, the contact surface area of the base electrode 102 is reduced, this leading to an increase in the base resistance. Thus, in an HBT structure such as shown in FIG. 9, in which the emitter is positioned over the collector, there is a tradeoff relationship that obtains between the base resistance and the collector capacitance, this acting to limit the value of fmax.

To solve the above-noted problem, an HBT has been proposed in which the positional relationship between the emitter and the collector is inverted. In the HBT shown in FIG. 10, the MBE (molecular beam epitaxy) method is used to grow, on a semi-insulator GaAs substrate 1, an emitter-contact layer 2 having a thickness of 500 nm made from an n-type GaAs with silicon added to a high concentration ($3\times10^{10}$ cm$^{-3}$), an emitter layer 3 having a thickness of 250 nm made of n-type Al$_{0.25}$Ga$_{0.75}$As with silicon added to a medium concentration ($5\times10^{17}$ cm$^{-3}$), a base layer 4 having a thickness of 80 nm and made from p-type GaAs with beryllium added to a high concentration ($4\times10^{19}$ cm$^{-3}$), a collector layer 5 having a thickness of 500 nm made of n-type GaAs having silicon added to a low concentration ($5\times10^{16}$ cm$^{-3}$), and a collector contact layer 6 having a thickness of 50 nm made of n-type GaAs with silicon added to a high concentration ($3\times10^{18}$ cm$^{-3}$), these being formed in the above-noted sequence.

Figure 10:
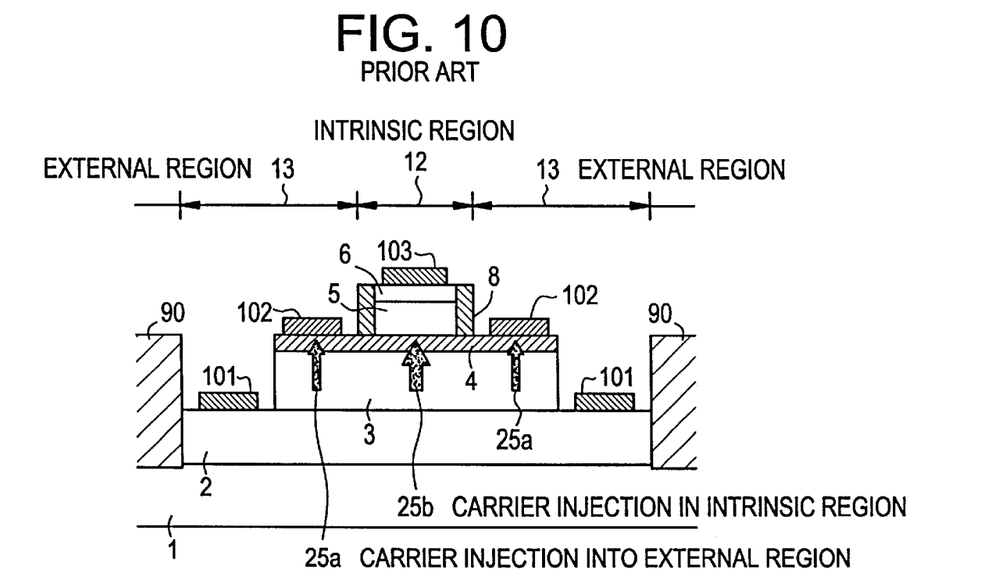
FIG. 10 is a cross-sectional view that illustrates an inverted-structure (collector on top) HBT from the prior art.

As can be seen from the drawings, because the collector capacitance only occurs in the element intrinsic region 12, compared with the bipolar transistor shown in FIG. 9, in which the emitter is on top, it is possible to greatly reduce the collector capacitance. In an HBT having this type of inverted structure, however, the injection path of minority carriers from the emitter layer 3 to the base layer 4 (in this prior art example, because of the npn junction transistor, the electrons in the p-type base layer corresponding to minority carriers) is not only the path in the intrinsic region 12 (shown as the position 25b in the drawing), but also the path in the external region 13 (shown as the position 25a in the drawing).

While part of the minority carriers that are injected via the former path are lost through recombinations occurring at the junction boundary between the base layer 4 and the emitter layer 5 or within the base layer 4, a large number flow toward the collector layer 5. Almost all of the minority carriers that are injected via the later path recombine with pseudo-minority carriers (in this prior art example, because of the npn junction, these being positive holes) supplied from the base electrode 102, so that they do not contribute to current-amplitude effect of the transistor. Therefore, the proportion of minority carriers injected into the base layer 4 from the emitter layer 3 that are reclaimed in the collector layer 5 is much smaller than 1, and as a result there is a significant deterioration of the current gain. Thus, whether it is possible to achieve a high-performance inverted structure HBT depends on how effectively the minority carrier injection 25a in the element external region 13 can be suppressed.

Figure 11:
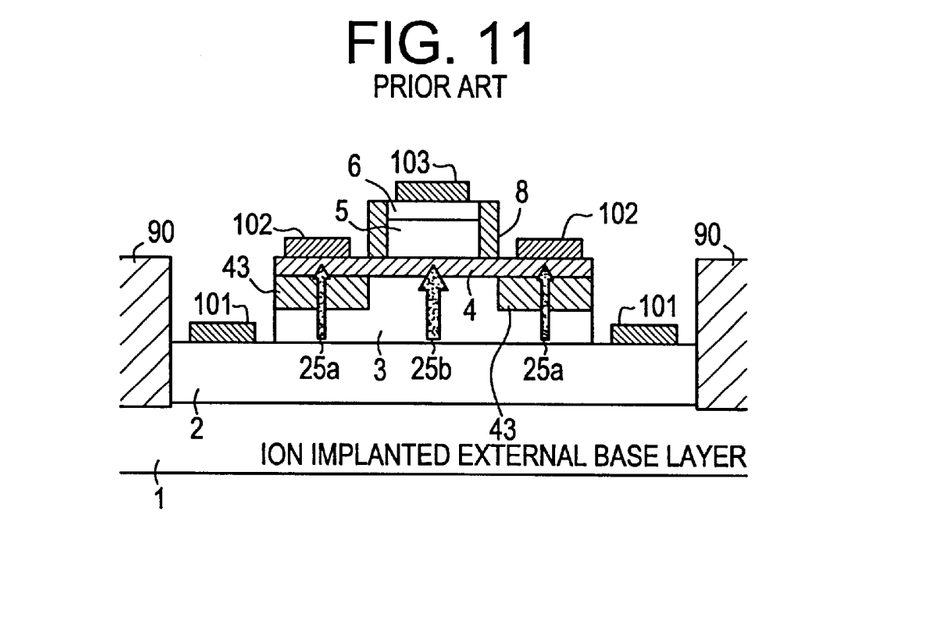
FIG. 11 is a cross-sectional view that illustrates an inverted-structure (collector on top) HBT from the prior art.

In view of the above-noted problem with regard to an inverted HBT structure, Kroemer has proposed an element structure that suppresses minority carrier injection in the element external region (page 30, Vol. 70, Proceedings of IEE, 1982). FIG. 11 is a cross-sectional view of a prior art inverted structure HBT that recreates the basic concept of Kroemer While manufacturing method of the transistor in FIG. 11 is basically the same as for an HBT having a structure such as shown in FIG. 10, a feature of this element is the implantation of a p-type impurity (for example, Mg or Be) into the element external region 13, from the base layer 4 to the emitter layer 3, part of the emitter layer 3 being thereby changed from an n-type semiconductor to a p-type semiconductor so as to form an ion-implanted external base layer 43. After the ion implantation, to activate the p-type impurity, lamp annealing is usually done over a short period of time (at approximately 850°C.). Because the p-n junction that is formed in the element external region 13 is a p-n junction of the same $Al_{0.25}Ga_{0.75}As$ materials, the threshold emitter voltage value (with respect to the base) at which minority carrier injection occurs is established by the energy band gap of the $Al_{0.25}Ga_{0.75}As$, this being approximately 1.7 volts. In the case of the p-n junction that is formed between the base and the emitter in the element intrinsic region 12, the emitter voltage threshold value is established by the base layer 4, which is made of GaAs, which has a relatively small energy band gap, this being approximately 1.4 volts. Because the emitter current is established as an exponential function of the emitter voltage, a very small change in the current threshold value that occurs between the element external region 13 and the element intrinsic region 12, given the same emitter voltage condition, leads to a suppression of minority carrier injection in the element external region 13, thereby achieving a degree of effectiveness.

Figure 12:
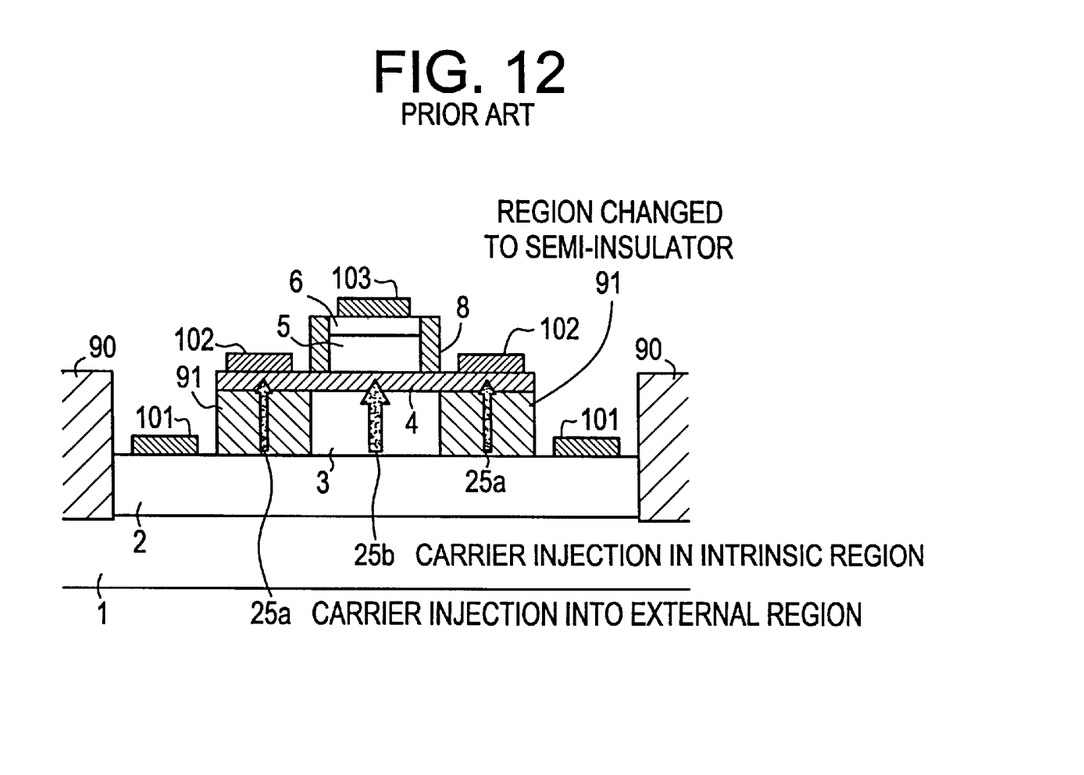
FIG. 12 is a cross-sectional view that illustrates an inverted-structure (collector on top) HBT from the prior art.

In the prior art example that is shown in FIG. 12, ion implantation of hydrogen, boron, or oxygen or the like is done into the emitter layer 3 of the element external region 13, so as to form a semi-insulator region 91. This method, by making de-activating the emitter layer 3 of the element external region 13, prevents the injection of unwanted minority carriers in this region, and also has the feature that it does not require high-temperature processing.

In the prior art example that is shown in FIG. 11, however, because high-temperature heat treating is required in order to activate the p-type impurity that is ion injected, the impurities in each of the semiconductor layers in the element intrinsic region disperse, thereby resulting in a great change in the distribution of impurities. In the prior art as shown in FIG. 12, while high-temperature processing is not required, if the ion implantation dose amount is high enough to change the emitter layer 3 of the element external region 13 into a semi-insulator, the damage to the base layer 4 through which the ions pass becomes great. The damage to the base layer 4 leads to a lowering of the mobility and concentration of carriers in the base layer, this causing an increase in the sheet resistance of the base layer 4 and the contact resistance of the base electrode 102. If the dose amount is lower to a level at which damage to the base layer 4 is suppressed, there is the problem of not being able to sufficiently reduce injecting minority carriers in the element external region 13.

Accordingly, an object of the present invention is to improve over the above-noted drawbacks in the prior art, by providing a high-performance bipolar transistor which suppresses the injection of parasitic minority carriers in the element external region, and by providing a method of manufacturing the above-noted bipolar transistor.

SUMMARY OF THE INVENTION

In order to achieve the above-noted objects, the present invention adopts the following basic technical constitution.

Specifically, a first aspect of a bipolar transistor according to the present invention is a bipolar transistor which has an emitter contact layer formed on a semiconductor substrate, an emitter layer formed onto said emitter contact layer, a base layer that serves as the transistor region and an external base layer that serves as a base extension part formed over the emitter layer, and a collector layer that is formed onto said base region, said layers being formed in this sequence, wherein said bipolar transistor being provided with a buffer emitter layer in said emitter layer of a transistor region that makes contact with said base layer, thereby the effective energy barrier of minority carriers that are injected from said emitter layer into said base layer is lowered, and the energy barrier of minority carriers that are injected from said emitter layer into said external base region is increased without providing said buffer emitter layer in said transistor external region that is adjacent to said transistor region.

In a second aspect of the above-noted bipolar transistor, the energy band gap of the above-noted buffer emitter layer becomes smaller than the energy band gap of the emitter layer as the distance to the base layer becomes smaller.

In a third aspect of the above-noted bipolar transistor, the energy band gap of the above-noted buffer emitter layer is the same as the energy band gap of the base layer.

In a fourth aspect of the above-noted bipolar transistor, the energy band gap of the above-noted buffer emitter layer is a width that is between the energy band gap of the base layer and the energy band gap of the external base layer.

In a fifth aspect of the above-noted bipolar transistor, the energy band gap of the above-noted base layer is smaller than the energy band gap of the external base layer.

In a sixth aspect of the above-noted bipolar transistor, the impurity concentration in the buffer emitter layer is higher than the impurity concentration in the emitter layer.

A method of manufacturing a bipolar transistor according to the present invention, is a method of manufacturing a bipolar transistor which has an emitter contact layer, an emitter layer, a base layer, and a collector layer that are formed in this sequence onto a semiconductor layer, wherein the part of the emitter layer that makes contact with the base layer being provided with a buffer emitter layer so that the energy barrier of minority carriers injected into the base layer is effectively reduced, this manufacturing method having a step of removing the above-noted collector layer, base layer, and buffer emitter layer in the transistor external region, so as to form an external base layer on the surface of the emitter layer.

In a second aspect of the above-noted method of manufacturing a bipolar transistor, the energy band gap of the above-noted buffer emitter layer is made smaller than the energy band gap of the emitter layer as the distance to said base layer becomes smaller.

In a third aspect of the above-noted method of manufacturing a bipolar transistor, the energy band gap of the above-noted buffer emitter layer is made the same as the energy band gap of the base layer.

In a fourth aspect of the above-noted method of manufacturing a bipolar transistor, the energy band gap of the above-noted buffer emitter layer is made a width that is between the energy band gap of the base layer and the energy band gap of the external base layer.

In a fifth aspect of the above-noted method of manufacturing a bipolar transistor, the energy band gap of the above-noted base layer is made smaller than the energy band gap of the external base layer.

In a sixth aspect of the above-noted method of manufacturing a bipolar transistor, the impurity concentration in the buffer emitter layer is made higher than the impurity concentration in the emitter layer.

A bipolar transistor according to the present invention is one in which an emitter contact layer is formed on a semiconductor substrate, an emitter layer being formed over this emitter contact layer, a base layer that serves as the transistor region and an external base layer that serves as a base extension part being formed over the emitter layer, and a collector layer being then formed over the base layer, in the sequence indicated herein. In this bipolar transistor, a composition gradient buffer emitter layer that forms part of the emitter layer between the emitter layer of the transistor region and the base layer is provided, the configuration being made such that the conductive band on the junction boundary surface between the emitter layer and the base layer is continuous, the conductive band on the junction boundary surface between the emitter layer and the external base layer being non-continuous, so that, without providing the above-noted composition gradient layer in the base extension part that is adjacent to the transistor region, the emitter is formed by the emitter layer and the composition gradient layer, the result being that the potential barrier of minority carriers in the transistor region is lowered and the flow of injected minority carriers from the emitter layer into the base layer is made smoothly. Additionally, by removing the composition gradient layer that acts to reduce the potential barrier in the element external region, the injection of parasitic minority carriers from the emitter layer into the external base layer is suppressed, thereby resulting in a high-performance inverted-structure bipolar transistor.

DESCRIPTION OF THE PREFERRED EMBODIMENTS

Preferred embodiments of a bipolar transistor and manufacturing method therefor according to the present invention are described below in detail, with reference being made to relevant accompanying drawings.

FIG. 1 is a drawing that shows the structure of an example of a bipolar transistor according to the present invention, and FIG. 5 is a drawing that shows the associated energy bands.

FIG. 1 and FIG. 5 illustrate a bipolar transistor in which an emitter contact layer 2 is formed on a semiconductor substrate 1, an emitter layer 31 being formed over this emitter contact layer 2, a base layer 41 that serves as the transistor region (element intrinsic region) and an external base layer that serves as a base extension part (external region) formed over the emitter layer 31, and a collector layer 5 being formed on the base layer 41, these layers being formed in the above-noted sequence. In this bipolar transistor, a composition gradient layer 32 that forms part of the emitter layer is provided between the emitter layer 31 of the transistor region 12 and the base layer 41, thereby the conductive band 21 on the junction boundary surface between the emitter layer 31 and the base layer 41 being continuous, and the conductive band on the junction boundary surface between the emitter layer 31 and the external base layer 42 being non-continuous, without providing the above-noted composition gradient layer 32 on the base extension part 13 that is adjacent to the transistor region 12.

Next, a specific example will be described.

Figure 1A:
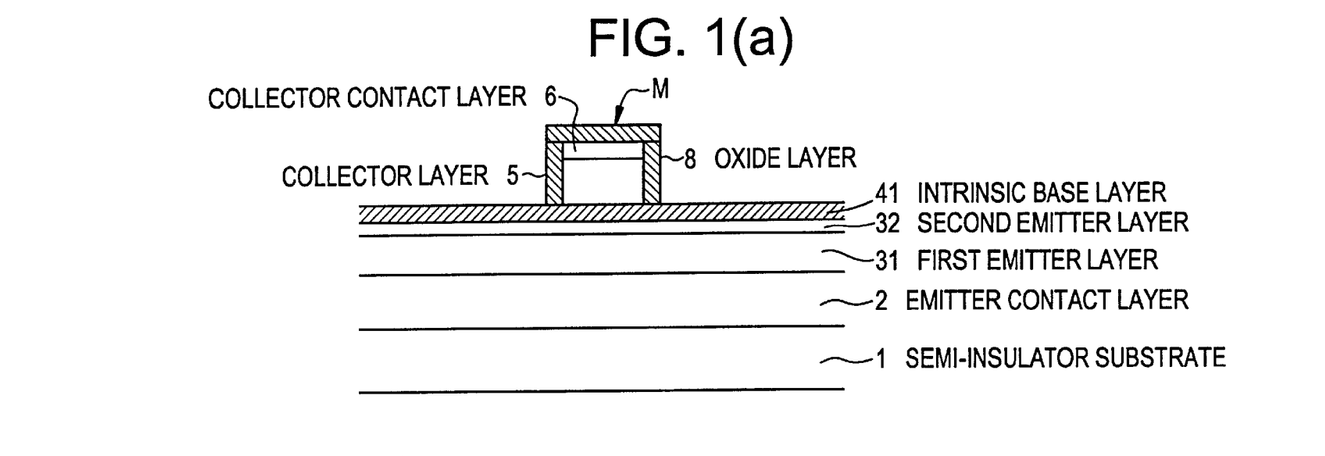
FIGS. 1(a)–1(c) are cross-sectional views that show the manufacturing process steps for an element that illustrates the first embodiment of the present invention.
Figure 1B:
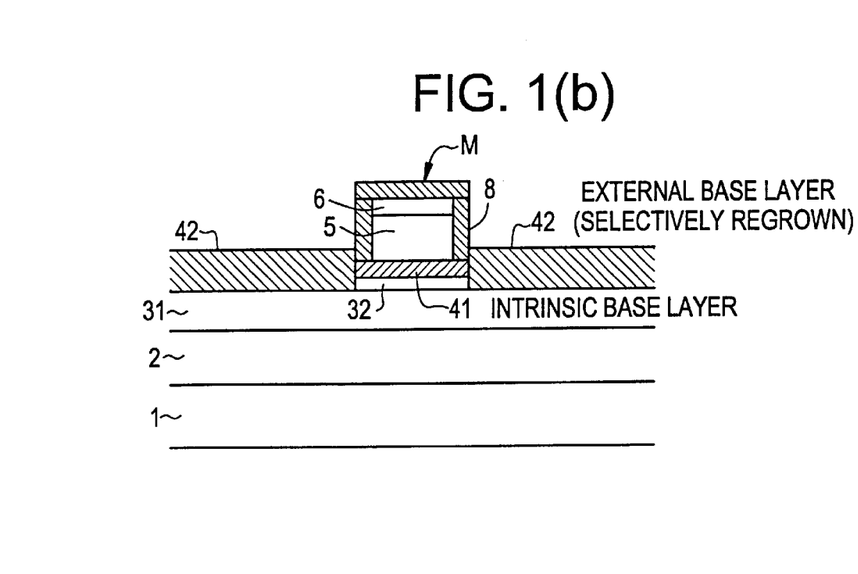
Figure 1C:
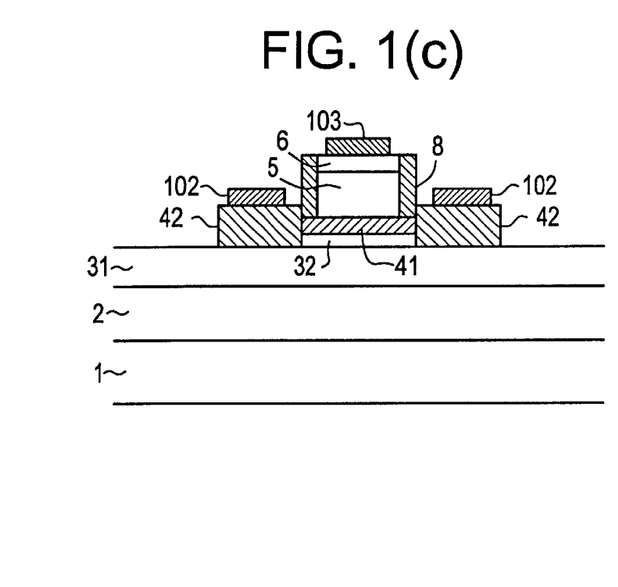
Figure 2:
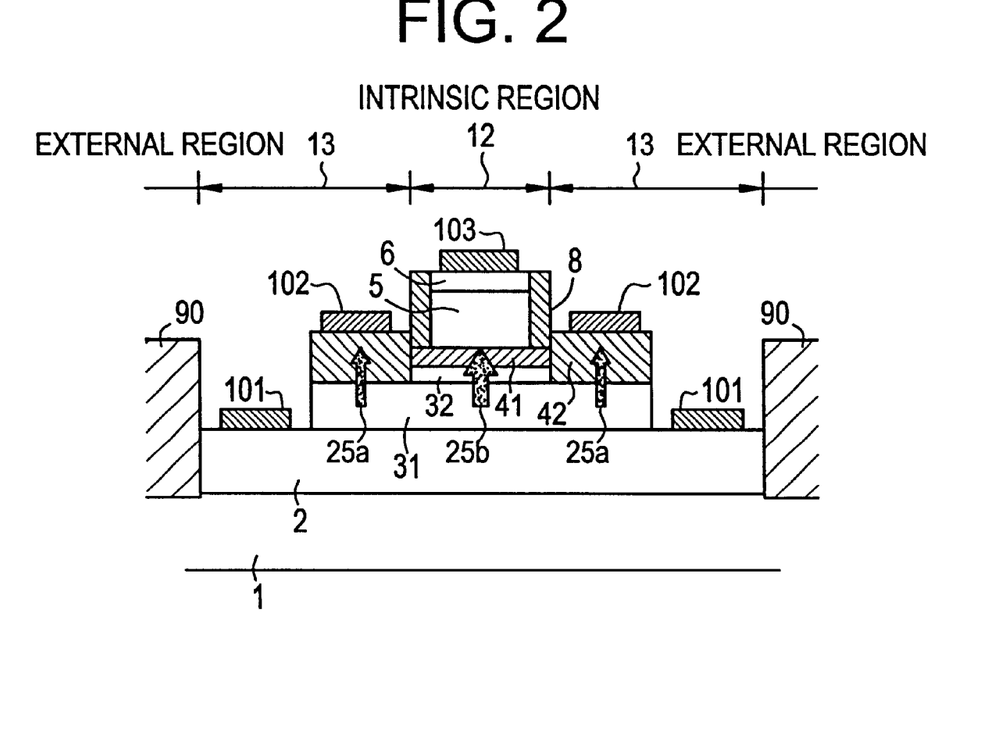
FIG. 2 is a cross-sectional view that shows the element that is obtained after the first step.

FIG. 1 is a process diagram that shows the typical manufacturing process steps for the present invention, and FIG. 2 is a cross-sectional view of a bipolar transistor.

In an HBT of this embodiment, an MBE (molecular beam epitaxy) method is used to grow, on a semi-insulator GaAs substrate 1, an emitter-contact layer 2 having a thickness of 500 nm made from an n-type GaAs with silicon added to a high concentration ($3\times10^{18}$ cm$^{-3}$), an emitter layer 31 having a thickness of 250 nm made of n-type Al$_{0.25}$Ga$_{0.75}$As with silicon added to a medium concentration ($5\times10^{17}$ cm$^{-3}$), an emitter layer 32 which is a composition gradient layer having a thickness of 100 nm and which is made from an n-type Al$_x$Ga$_{1-x}$As with silicon added to a medium concentration ($5\times10^{17}$ cm$^{-3}$) in which the aluminum component X varies along a gradient from 0.25 to 0, a base layer 41 having a thickness of 80 nm and being made from p-type GaAs with beryllium added to a high concentration ($4\times10^{19}$ cm$^{-3}$), a collector layer 5 having a thickness of 500 nm and being made of n-type GaAs having silicon added to a low concentration ($5\times10^{16}$ cm$^{-3}$), and an collector contact layer 6 having a thickness of 50 nm and being made of n-type GaAs with silicon added to a high concentration ($3\times10^{18}$ cm$^{-3}$), these crystal layers being grown in the sequence indicated above.

Referring to FIG. 1, as shown in FIG. 1(a), first the collector contact layer 6 and collector layer 5 are dry etched using chlorine gas to form the collector mesa M and expose the base layer 41, after which the area surrounding the collector mesa M is completely covered with an oxide film 8. Next, as shown in FIG. 1(b), using the collector mesa M as a mask, a phosphoric acid based etchant is used to remove the base layer 41 and the emitter layer 32. Next, a metal organic molecular beam epitaxy (MOMBE) method is used to regrow an external base layer 42 made from a p-type GaAs layer having a thickness of 300 nm, to which carbon of a high concentration ($2\times10^{20}$ cm$^{-3}$) is added onto the surface of the exposed emitter layer 31. When this regrowing is done, the growth is done with conditions under which selective growth occurs, with a polycrystal not grown on the surface of the oxide film 8 in the area surrounding the collector mesa M, polycrystal growth being done only on the surface the semiconductor.

Next, as shown in FIG. 1(c), an AuGe alloy electrode 103 is formed on the collector contact layer 6 and, after removing the unwanted part of the external base layer 42, with the exception of a region that is required for formation of a base electrode, a non-alloy electrode 102 of titanium, platinum, and gold is formed on the remaining external base layer 42. The completed element has a cross section as shown in FIG. 2, in which an AuGe alloy electrode 101, is formed on the emitter contact layer 2, and in which an element separation region 90 made from a semi-insulator layer is formed by means of ion implantation of hydrogen.

As shown in FIG. 2, in the element external region 13 of this HBT, the number of minority carriers that are injected into the external base layer 42 from the emitter layer 32 is held to a lower number than the number of minority carriers that are injected into the base layer 41 from the emitter layer 32.

The reason for this can be explained with reference to FIG. 5. FIG. 5(a) and FIG. 5(b) show the energy band structures is held to a lower number than the number of minority carriers that are injected into the base layer 41 from the emitter layer 32.

The reason for this can be explained with reference to FIG. 5. FIG. 5(a) and FIG. 5(b) show the energy band structures in the base-emitter junction for the HBT external region 13 and intrinsic region 12 shown in FIG. 2. In this drawing, the height of the quasi-Fermi levels 23 between the emitter layer 31 and the base layer 41 are the same, that is, the energy $qV_{BE}$ that corresponds to the voltages $V_{BB}$ that are applied between the base and emitter (indicated by 24 in the drawing) are the same, this comparison being made under the same bias conditions.

Figure 5A:
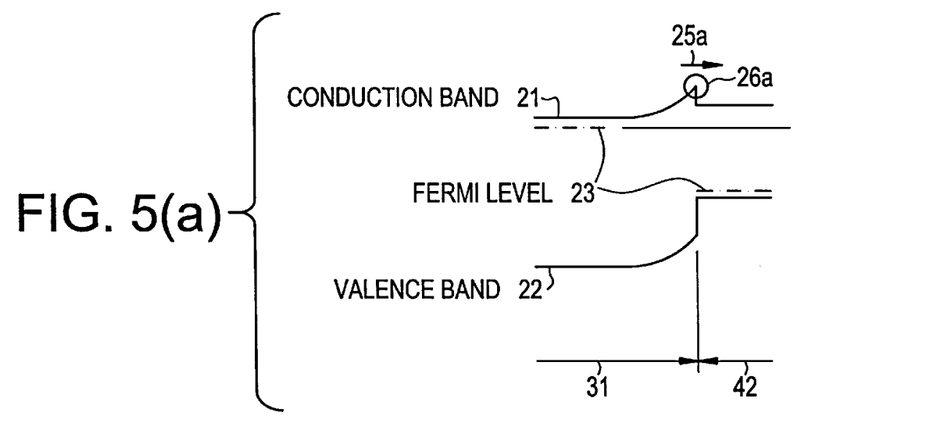
FIGS. 5(a)–5(b) are energy band structural diagrams that illustrate the principle of the first embodiment of the present invention.
Figure 5B:
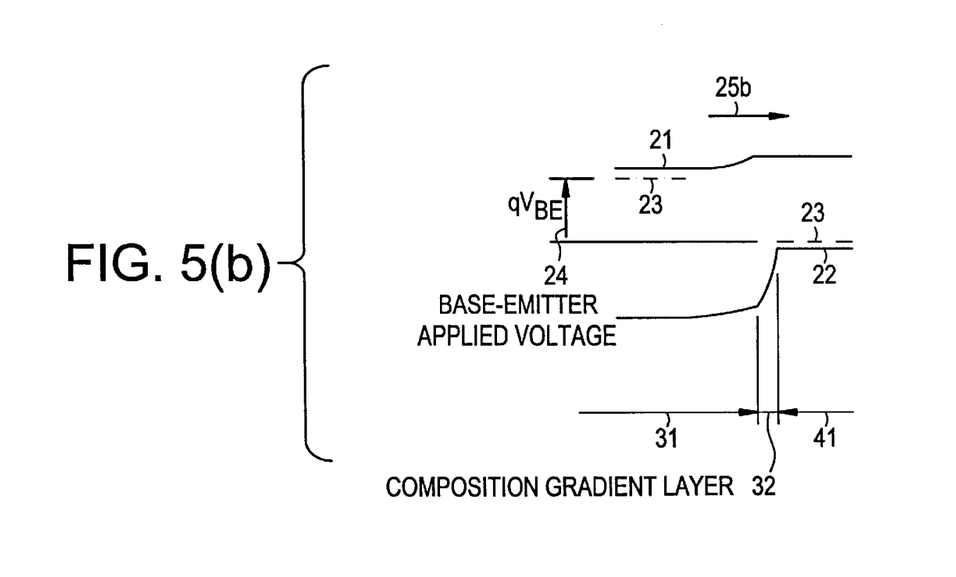

As can be seen from FIG. 5(a), in the element external region 13, because the composition gradient layer 32 has been removed, the conduction band 21 at the junction boundary surface between the emitter layer 31 and the external base layer 42 is non-continuous, this resulting in a band spike 26a. This band spike represents an energy barrier as viewed from the minority carriers that are injected into the external base layer 42 from the emitter layer 31, this acting to suppress the injection of minority carriers in this region. In the element intrinsic region 12, the composition gradient layer 32 smoothly connects the conduction band 21 from the emitter layer 31 towards the base layer 41, this serving to act as a buffer layer that causes smooth injection of carriers, so that a band spike does not occur, the result being a smooth flow of minority carriers (shown by 25b in this drawing). From the above, compared with the element intrinsic region 12, it is possible to greatly suppress the injection of minority carriers 25a in the element external region 13.

In this embodiment, the present invention is applied to an HBT in which the base-emitter junction in the element intrinsic region has a composition gradient hetero-junction structure. However, it is also possible to apply the present invention to an HBT having a stepped hetero-junction structure. The configuration of the latter case is shown in FIG. 6.

Figure 6A:
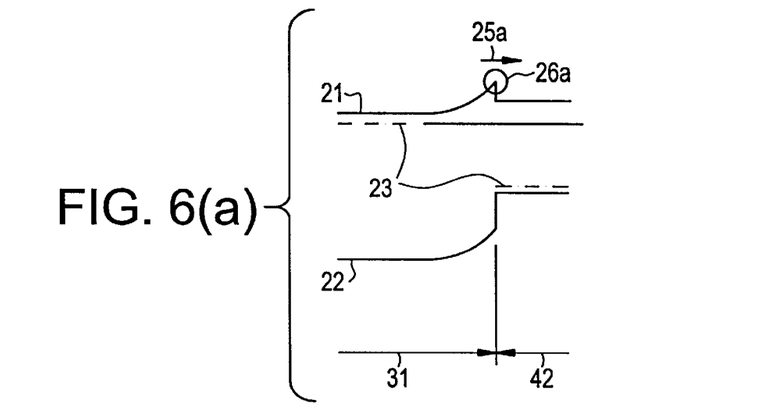
FIGS. 6(a)–6(c) are energy band structural diagram that illustrate the principle of the second embodiment of the present invention.
Figure 6B:
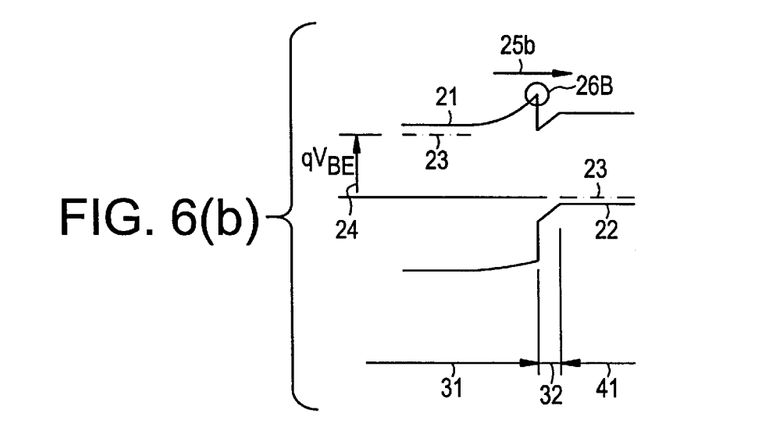
Figure 6C:
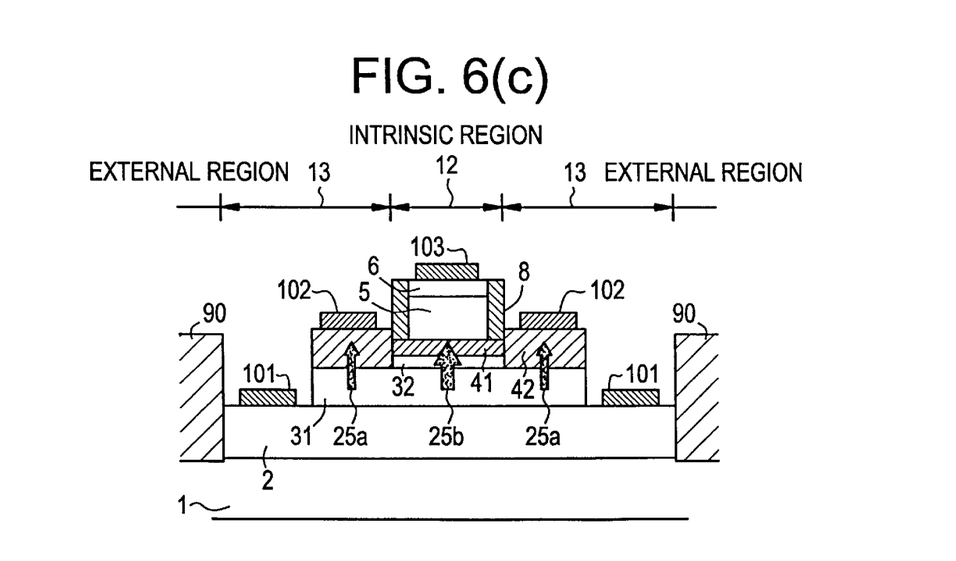

In FIG. 6, onto a semi-insulator GaAs substrate 1, a metal organic CVD (MOCVD) process is used to form an emitter contact layer 2 having a thickness of 500 nm and being made from an n-type GaAs to which silicon is added to a high concentration ($3\times10^{18}$ cm$^{-3}$), an emitter layer 31 having a thickness of 250 nm and being made from an n-type InGaP to which silicon is added to a medium concentration ($5\times10^{17}$ cm$^{-3}$), an emitter layer 32 having a thickness of 100 nm and being made of an n-type GaAs to which silicon has been added to a medium concentration ($5\times10^{17}$ cm$^{-3}$), a p-type GaAs base layer 41 having a thickness of 80 nm to which beryllium is added to a high concentration ($4\times10^{19}$ cm$^{-3}$), a collector layer 5 having a thickness of 500 nm and being made of an n-type GaAs to which silicon is added to a low concentration ($5\times10^{16}$ cm$^{-3}$), and a collector contact layer 6 having a thickness of 50 nm and being made of an n-type GaAs to which silicon is added to a high concentration ($3\times10^{10}$ cm$^{-3}$), these being formed in this sequence to form the crystal structure. The element processes are the same as discussed with regard to FIG. 1.

In this embodiment, as shown in FIG. 6(a), an emitter layer 31 made of InGaP and an external base layer 42 made of GaAs form a hetero-junction, the band spike 26a functioning to prevent minority carrier injection (shown by 25a in the drawing). In the element intrinsic region 12, because of the emitter layer 32 made of GaAs in the hetero-junction between the emitter and base, the height of the band spike 26b is lowered, so that, compared with the element external region 13 under the same bias condition, the injection of minority carriers is done more smoothly (shown by 25b in the drawing). In this embodiment as well, therefore, it is possible to suppress the unwanted injection of minority carriers in the element external region 13 to the minimum.

Although in the above-noted embodiment the emitter layer is formed by two semiconductor layer having different energy band gaps, it is also possible to apply the present invention to an HBT in which the energy band gap of the emitter layer is same. The configuration in this case is shown in FIG. 7, which is described below.

In this embodiment, onto a semi-insulator GaAs substrate 1, a metal organic CVD (MOCVD) process is used to form an emitter contact layer 2 having a thickness of 500 nm and being made from an n-type GaAs to which silicon is added to a high concentration ($3\times10^{18}$ cm$^{-3}$), an emitter layer 31 having a thickness of 250 nm and being made from an n-type InGaP to which silicon is added to a medium concentration ($5\times10^{17}$ cm$^{-3}$), an emitter layer 32 having a thickness of 50 nm and being made of an n-type GaAs to which silicon is added to a high concentration ($1\times10^{18}$ cm$^{-3}$), a base layer 41 having a thickness of 80 nm and being made of a p-type GaAs to which beryllium is added to a high concentration ($4\times10^{19}$ cm$^{-3}$), a collector layer 5 having a thickness of 500 nm and being made of an n-type GaAs to which silicon is added to a low concentration ($5\times10^{16}$ cm$^{-3}$) and a collector contact layer 6 having a thickness of 50 nm and being made of an n-type GaAs to which silicon is added to a high concentration ($3\times10^{18}$ cm$^{-3}$), these being grown in this sequence to form the crystal structure. The element processes are the same as discussed with regard to FIG. 1.

Figure 7A:
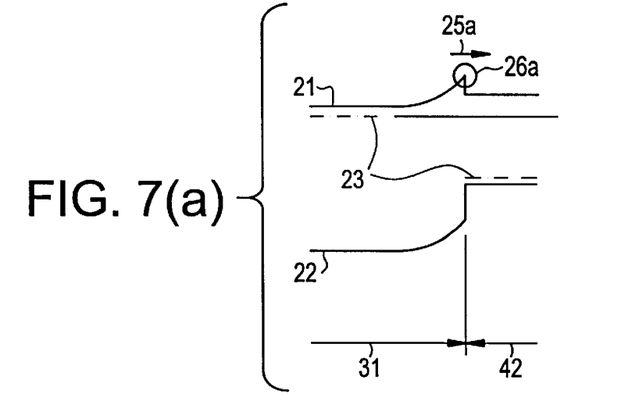
FIGS. 7(a)–7(c) are energy band structural diagrams that illustrate the principle of the third embodiment of the present invention.
Figure 7B:
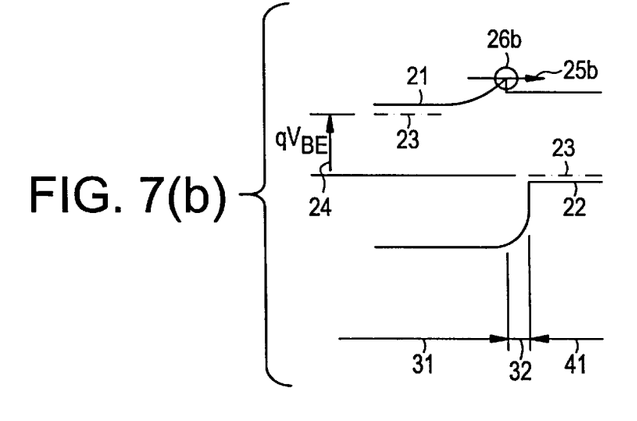
Figure 7C:
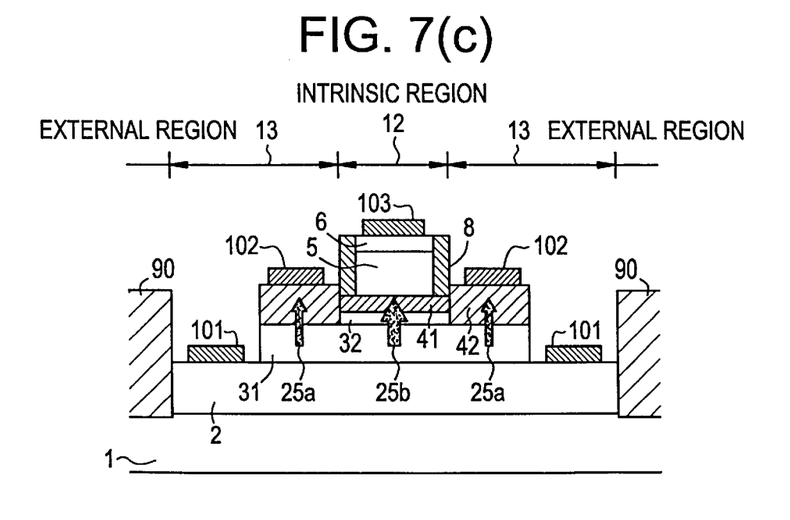

In this embodiment, in the element external region (as shown in FIG. 7(a)) there is a hetero-junction formed between the emitter layer 31 made of InGaP, which has a relatively low impurity concentration, and the external base layer 42 which is made of GaAs, the band spike 26a acting so as to prevent the injection of minority carriers (position 26a in the drawing). In the element intrinsic region 12, because there is an emitter layer 32 that has an impurity concentration that is higher than the impurity concentration of the emitter layer 31, as shown by 26b in the drawing, the width of the band spike is made narrow, so that minority carriers can easily flow past the band spike 26b by means of the tunneling effect (shown by 26b in the drawing). In this embodiment as well, therefore, the unwanted injection of minority carriers 25a is minimized in the element external region 13.

Figure 8A:
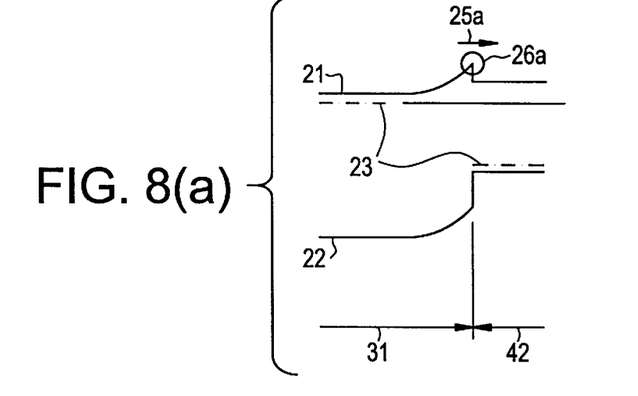
FIGS. 8(a)–8(c) are energy band structural diagrams that illustrate the principle of the fourth embodiment of the present invention.
Figure 8B:
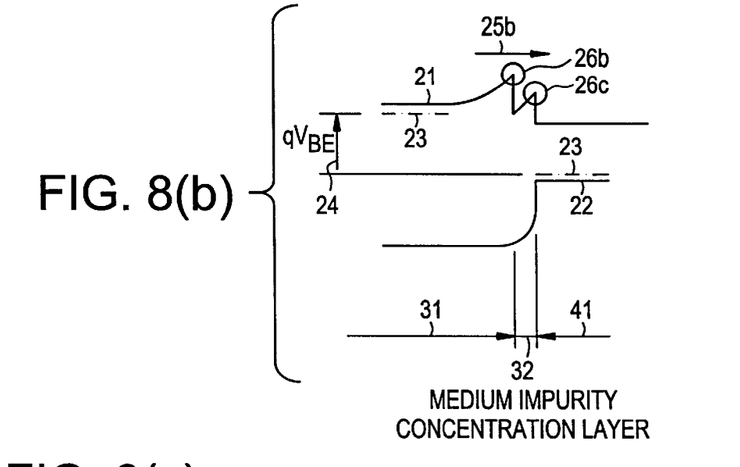
Figure 8C:
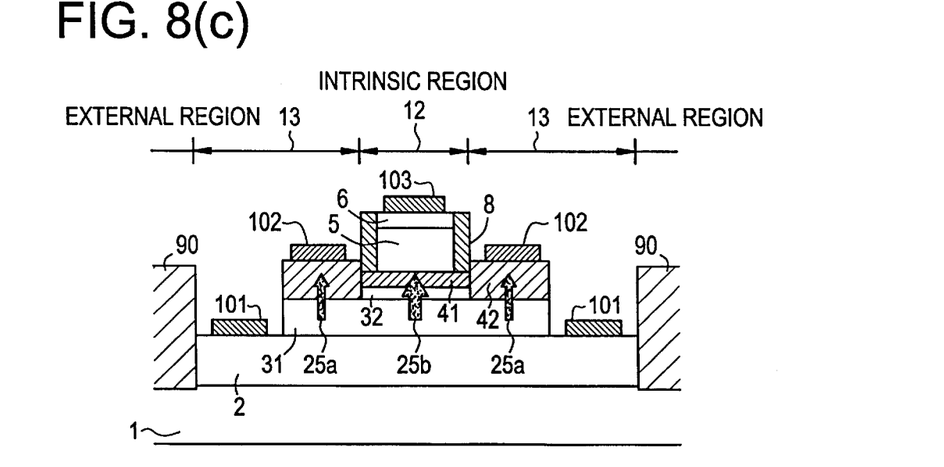

While in the above embodiment the base layer 41 of the element intrinsic region 12 and the external base 42 of the element external region 13 have the same energy band gaps, it is also possible to apply the present invention to an HBT that has a combination of base layers that have different energy band gaps, the configuration in this case being shown in FIG. 8.

In this embodiment, onto a semi-insulator GaAs substrate 1, a metal organic CVD (MOCVD) process is used to form an emitter contact layer 2 having a thickness of 500 nm and being made of n-type GaAs to which silicon is added to a high concentration ($3\times10^{18}$ cm$^{-3}$), an emitter layer 31 having a thickness of 250 nm and being made of an n-type InGaP to which silicon has been added to a medium concentration ($5\times10^{17}$ cm$^{-3}$), an emitter layer 32 having a thickness of 100 nm and being made of an n-type GaAs to which silicon is added to a medium concentration ($5\times10^{17}$ cm$^{-3}$), a base layer 41 having a thickness of 40 nm and being made of a p-type $In_{0.1}Ga_{0.9}As$ to which beryllium is added to a high concentration ($4\times10^{19}$ cm$^{-3}$), a collector layer 5 having a thickness of 500 nm and being made of an n-type GaAs to which silicon is added to a low concentration ($5\times10^{18}$ cm$^{-3}$) a collector contact layer 6 having a thickness of 50 nm and being made of an n-type GaAs to which silicon is added to a high concentration ($3\times10^{18}$ cm$^{\times3}$), these being grown in this sequence to form the crystal structure. The element processes are the same as discussed with regard to FIG. 1.

In this embodiment, in the element external region (shown in FIG. 8(a)) there is a hetero-junction formed between the emitter layer 31 made of InGaP and the external base layer 42 made of GaAs, the band spike 26a acting so as to prevent injection of minority carriers (shown by 26a in the drawing). In the element intrinsic region 12, because the emitter layer 32, which is made of GaAs that has a relatively small energy band gap, between the emitter layer 31 and the base layer 41, the energy band gaps of the emitter layer 32 and the base layer 41 that is made of $In_{0.1}Ga_{0.9}As$ are different, the result being the occurrence of the band spike 26c. As a result, there are two band spikes in the area surrounding the base-emitter junction boundary, and because the energy band gap is reduced in two steps from the emitter towards the base, and also because the base layer 41 made of $In_{0.1}Ga_{0.9}As$, which has an energy band gap that is smaller than that of the external base layer 42, is provided, compared to the element external region 13, the potential barrier is relatively low, so that there is a smooth injection of minority carriers (shown by 25b in the drawing). In this embodiment as well, therefore, the unwanted injection of minority carriers 25a is minimized in the element external region 13.

While in the above-noted embodiment, the injection of minority carriers in the element external region is suppressed, there is the drawback that the capacitance of the base-emitter junction is greater than in the case of an HBT with the emitter on top. Because of this drawback, in an inverted structure bipolar transistor according to the present invention, by removing part of the emitter layer of the element external region 13, it is possible to reduce the capacitance of the base-emitter junction to a low value, the configuration in this case being that shown in FIG. 3.

Figure 3:
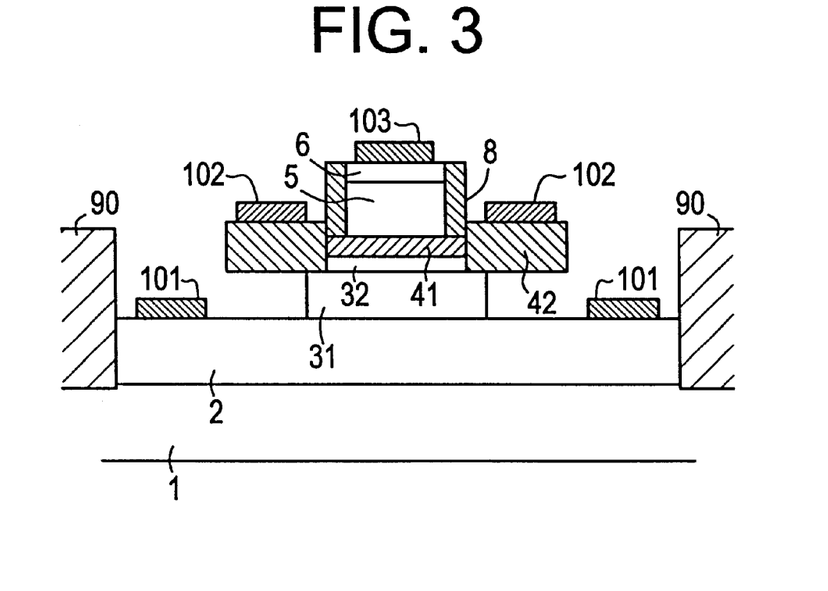
FIG. 3 is a cross-sectional view that illustrates another embodiment of the present invention.
Figure 4:
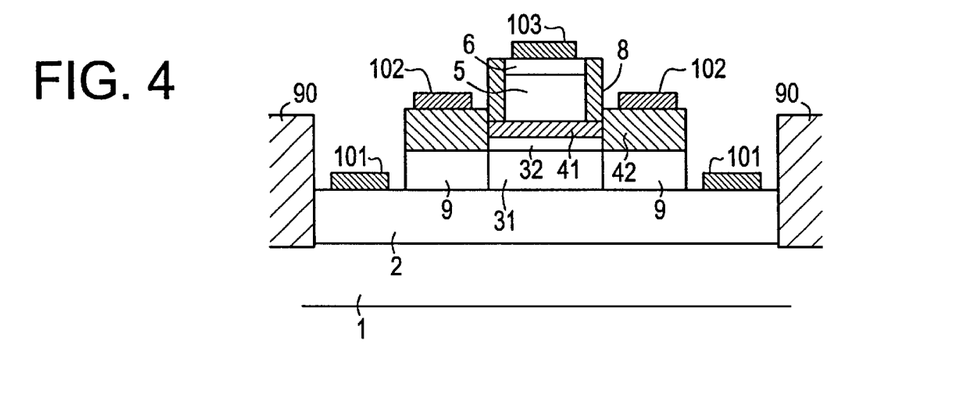
FIG. 4 is a cross-sectional view that illustrates another embodiment of the present invention.

In this embodiment, an emitter layer 31 is made of n-type InGaP, an emitter layer 32 is made of n-type GaAs, and emitter contact layer 2 is made of n-type GaAs, and chlorine-based etchant that does not affect the GaAs layers is used to selectively etch part of the emitter layer 31 which is positioned beneath the external base layer 42, thereby reducing the base-emitter junction capacitance. Even if the method of ion implantation is used to change the emitter layer into a semi-insulator, it is possible to reduce the base-emitter junction capacitance to a low value. The configuration in this case is shown in FIG. 4. In this embodiment, before forming the external base layer 42, ion implantation of boron is done into the emitter layer 31 of the element external region 13 (with an energy of 100 kV and a dose amount of $1\times10^{12}$ cm$^{-3}$) so as to make the external base layer 42 made of semi-insulator. In this case, because the external base layer 42 is formed after the ion implantation, there is no concern about increasing the base resistance by performing ion implantation. In the ion implantation to change the emitter layer 31 to a semi-insulator, in addition to boron, it is effective to use ions of hydrogen, oxygen, and helium.

Although in the above-noted embodiment, the HBT is one that is formed on a GaAs substrate, it is also possible to apply the present invention to an HBT that is formed onto any type of substrate, such as silicon, indium phosphorus (InP), or gallium nitride (GaN).

In the present invention as describe above a buffer emitter layer 32 is provided on a part of the emitter layer in the transistor region 12 that makes contact with the base layer 41, the configuration being such that the effective energy barrier with respect to minority carriers that are injected from the emitter layer 31 into the base layer 41 is reduced, and also such that the energy barrier of minority carriers that are injected from the above-noted emitter layer 31 into the external base region 32 is increased without providing the above-noted buffer emitter layer in the transistor external region 13 that is adjacent to the transistor region 12.

As described in detail above, according to the present invention, in the element intrinsic region 12, of the semiconductor layer 31 and semiconductor layer 32 that form the emitter, the semiconductor layer 32 that makes contact with the base layer 41 is used as a buffer layer that minority carrier potential barrier is lowered, thereby causing smooth flow of minority carriers that are injected from the emitter layer into the base layer, and in the element external region 13, the buffer emitter layer 32 that acts to reduce the potential barrier is removed, thereby suppressing the injection of minority carriers from the emitter layer 31 into the external base layer 42, the result being the achievement of a high-performance inverted-structure bipolar transistor wherein parasitic minority carrier injection in the element external region 13 is suppressed.

It is obvious that the present invention is not restricted to the above-described embodiments, the present invention being amenable to a range of variations within the technical scope thereof.

What is claimed is:

1. A method of manufacturing a bipolar transistor having an emitter contact layer, an emitter layer, a base layer, and a collector layer laminated in this sequence on a semiconductor substrate, said manufacturing method comprising:

providing a part of the emitter layer that makes contact with said base layer with a buffer emitter layer so that an energy barrier of minority carriers injected into said base layer is effectively reduced; and removing said collector layer, base layer, and buffer emitter layer in a transistor external region, to form an external base layer on a surface of said emitter layer.

2. A bipolar transistor according to claim 1, wherein an energy band gap of said buffer emitter layer is not equal to an energy band gap of said external base layer.

* * * * *

UNITED STATES PATENT AND TRADEMARK OFFICE
CERTIFICATE OF CORRECTION

PATENT NO. : 6,426,266 B1
DATED : July 30, 2002
INVENTOR(S) : Shinichi Tanaka

It is certified that error appears in the above-identified patent and that said Letters Patent is hereby corrected as shown below:

Column 7,
Line 51, delete "$V_{BB}$" insert -- $V_{BE}$ --

Column 9,
Line 43, delete "(5 x $10^{18}$ $cm^{-3}$)" insert -- (5 x $10^{16}$ $cm^{-3}$) --;
Line 45, delete "(3 x $10^{18}$ $cm^{x3}$)" insert -- (3 x $10^{18}$ $cm^{-3}$) --

Signed and Sealed this

Third Day of December, 2002

JAMES E. ROGAN
*Director of the United States Patent and Trademark Office*